United States Patent [19]

Fish

[11] 3,728,719

[45] Apr. 17, 1973

[54] R-2R RESISTIVE LADDER, DIGITAL-TO-ANALOG CONVERTER

[75] Inventor: Franklin H. Fish, Indianapolis, Ind.

[73] Assignee: The United States of America as represented by the Secretary of the Navy

[22] Filed: Mar. 20, 1972

[21] Appl. No.: 236,418

[52] U.S. Cl. ........................340/347 DA, 340/347 SY

[51] Int. Cl. ..............................................H03k 13/02

[58] Field of Search ................340/347 AD, 347 DA, 340/347 SY; 235/197; 318/654, 655, 605

[56] References Cited

UNITED STATES PATENTS

| | | | |
|---|---|---|---|
| 3,566,393 | 2/1971 | Girault et al. | 340/347 DA |
| 3,675,234 | 7/1972 | Metz | 340/347 DA |
| 3,553,647 | 1/1971 | Bullock | 340/347 DA |
| 3,480,947 | 11/1969 | Naydan | 340/347 DA |
| 3,307,173 | 2/1967 | Popodi et al. | 340/347 DA |

*Primary Examiner*—Charles D. Miller
*Attorney*—R. S. Sciascia et al. and P. S. Collignon

[57] ABSTRACT

A digital-to-analog converter having digital angular data inputs applied to integrated switches to cause predetermined switching in circuit with resistance ladder networks of R and 2R values providing sine and cosine approximation analog voltage functions representing the digital input signals some of which digital signals control quadrant switches to produce quadrant reference phase relationships and the remainder of such control analog signals to provide amplitude scaling to drive a synchro mechanism in angular correspondence with the digital angular data inputs.

8 Claims, 4 Drawing Figures

R-2R RESISTIVE LADDER, DIGITAL-TO-ANALOG CONVERTER

BACKGROUND OF THE INVENTION

This invention relates to digital-to-analog converters and more particularly to the use of an R-2R resistive ladder network to implement both the pseudo sine and cosine functions whose ratio very precisely approximates the tangent function to produce analog voltage drive for synchro mechanisms adaptable in the use of integrated circuits (IC) providing more reliable, less costly, lighter weight, and less volume circuits than previously employed converters.

There are many applications that require the conversion of digital angular data to analog angular data. For example, the bearing information from a submarine sonar processor must be converted from digital format to analog format before it can be used by the fire control system of a ship. Similarly, the information from an aircraft central data processor must be converted to analog format before it can be utilized by the servomechanism of automatic pilot or armament control of an aircraft. All of these applications require electronic digital-to-synchro converters which are of minimum size and have high reliability.

SUMMARY OF THE INVENTION

In the present invention a sine function generator and a cosine function generator each consist of a plurality of solid state switches with the output of each coupled through R-2R resistance ladder networks to a common output. Each solid state switch switches alternately between two inputs and is under the control of digital bit inputs selected through latching and true or complement networks. A quadrant switching circuit switches phased signals to one of the two inputs of the solid state switches under the control of the digital input signals and the other of the two inputs to the solid state switches are coupled in feedback respectively from the resistance ladder networks through appropriate gain circuits. Digital inputs representative of angular rotative data is converted to analog sine function and cosine function voltage outputs directly for two-phase synchros or through a Scott-T transformer appropriate for three-phase synchro angular follow-up. It is accordingly a general object of this invention to provide a digital-to-analog converter with accurately weighted resistance ladder values for developing angular analog voltage representations throughout 360 degrees corresponding to the digital angular signal data.

BRIEF DESCRIPTION OF THE DRAWING

These and other objects and the attendant advantages, features and uses of the invention will become more apparent to those skilled in the art as a more detailed description proceeds when considered along with the accompanying drawings in which.

DESCRIPTION OF THE PREFERRED EMBODIMENT

Figure 1:
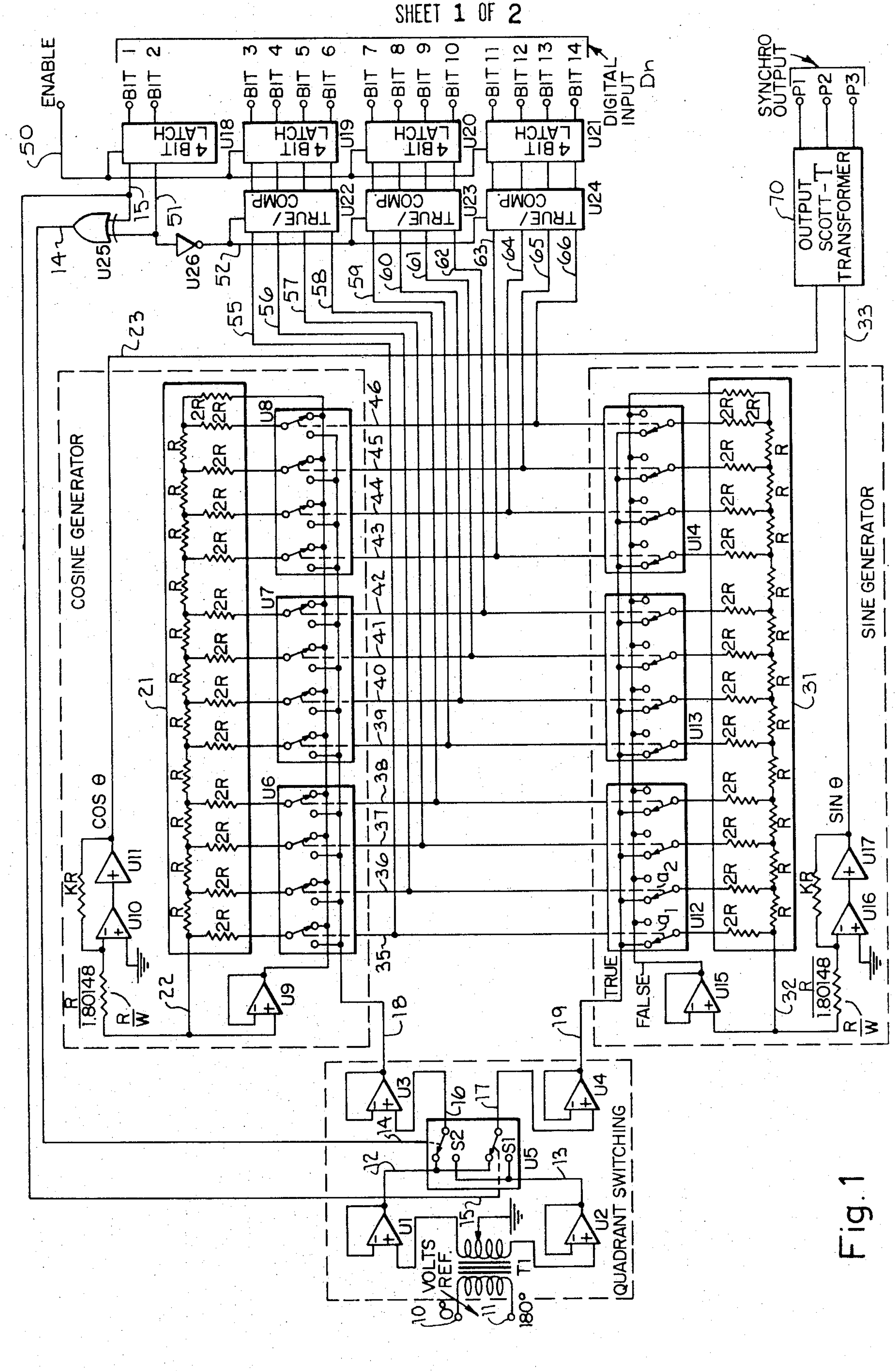
FIG. 1 is a complete circuit schematic partially in block of the digital-to-synchro converter of this invention.

Referring more particularly to FIG. 1, an alternating current (AC) reference voltage is applied to terminals 10 and 11 producing a circuit through the primary of a transformer T1 in a quadrant switching network illustrated within broken lines. The transformer T1 has a secondary which is center-tapped to ground with one secondary lead coupled to the positive input of an impedance isolation amplifier U1, preferably of solid state, and the opposite terminal of the secondary is coupled as a positive input to an impedance isolation amplifier U2. The output 12 of U1 is coupled to the upper terminals of a dual, bipolar solid state switching circuit S1 and S2 in the IC component U5. The output 13 of U2 is coupled to the corresponding lower contacts of S1 and S2 in U5. Terminals 14 and 15 control the switching arrangement of U5 which in actual practice is a solid state switching arrangement in the IC and is illustrated for the purpose of better understanding as mechanical switch contacts for the outputs 16 and 17 being alternately and independently switchable between the upper and lower contacts of switches S1 and S2. The output of switch S2 on 16 is coupled to the positive input of an impedance isolation amplifier U3 while the output of switch S1 is coupled by conductor 17 to the positive input of an impedance isolation amplifier U4. The outputs 18 and 19 each produce "false" and "true" phase signals of 0° and 180° in accordance with the switched positions of S1 and S2 in response to control voltages on conductors 14 and 15. For example, as shown by the switched positions of U5 in FIG. 1, the "false" phase 0° signals are being conducted to the outputs 18 and 19, respectively. Either switch S1 or S2 would produce a "true" signal of 180° on the outputs 19 and 18, respectively, if S1 or S2 were switched to the lower contact position.

The output 18 of the quadrant switching circuit is coupled in common to all the left input terminals of U6, U7, and U8 in a cosine generator, G(cos), shown enclosed within a block of dashed lines. In like manner the phase signal on the output 19 is coupled to all the left input terminals of U12, U13, and U14 within a sine generator, G(sin), shown enclosed within a block of dashed lines. U6, U7, U8, U12, U13, and U14 each represent integrated circuits, each of four bipolar switches which are available on the commercial market, one example being available under the designation AD555 produced by Analog Devices, Inc. These IC's are solid state but are herein illustrated for operational understanding as showing a mechanical switch contact alternately seated between the bipolar inputs and each under the control of a control terminal in accordance with the digital voltage applied thereto. Each bipolar switch is independent and has an output from the switch blade thereof as an input through a resistance ladder 21 consisting of a series of resistors R, which are all equal in value, with the inputs from the IC U6, U7, and U8 being through resistors designated herein as 2R in which the 2R resistors are exactly double in value to the R resistors. The resistance ladder 21 has one 2R resistor in series with the R resistors and is coupled to the output of an impedance isolation amplifier U9 having its positive input coupled to the output 22 of the resistance ladder. The output 22 of the resistance ladder 21 is likewise coupled through an R/W resistor to the negative input of a scale factor amplifier U10 in series with an amplifier U11 to an output 23 of the cosine generator 21. A feedback from the output of U11 to the negative input of U10 is through a resistor, herein identified as KR, where K represents the gain of the amplifier combination. The resistor R/W will be described further in the description hereinbelow of FIG. 2 to develop the value of W. In like manner the sine generator has the outputs U12, U13, and U14 coupled through the resistance ladder 31 to produce on the output 32, the analog voltage corresponding to the controlled positions of all the bipolar switches which output 32 is coupled through the resistor R/W and gain amplifier U16 and U17 in series to the output 33. In like manner the sine generator has a signal of gain K fed back through a resistor designated herein as KR in which K is the gain constant. The signals fed back through the amplifiers U9 and U15 from the outputs 22 and 32 on the resistance ladders 31 and 21 to the respective bipolar switches will be designated herein as "false" signals while the signal inputs from 18 and 19 to the cosine and sine generator, respectively, will be referred to as either "true" or "false" signals. The bipolar switches designated in the sine generator as $a_1$, $a_2$, $a_3$, etc., through $a_{12}$ have corresponding switches in the cosine generator in which corresponding control terminals will be coupled in common, as shown by the coupling connectors 35 through 46. The bipolar switches $a_1$ represent the most significant bit (MSB) under the control of the common coupling 35 while the bipolar switches $a_{12}$ in both sine and cosine generators represent the least significant bit (LSB) under the control of the common coupling 46. All bipolar switches $a_2$ through $a_{11}$ have the control terminals correspondingly coupled by 36 through 45 in decreasing significance from $a_2$ to $a_{11}$. The cosine generator is identical to the sine generator except that the "1s" complement of the digital angle is applied to the input. The "1" complement is implemented by simply exchanging the "true" and "false" switch poles, as shown in FIG. 1 The conversion of the digital input signals to analog signals in the sine and cosine generators will now be described.

Digital inputs representative of an angular relation read-out from a submarine sonar processor or an aircraft central data processor are applied as bits 1 through 14 and herein designated as $D_n$. The first two bits 1 and 2 are applied to a 4-bit latch circuit U18, only two of which are used. Bits 3 through 6 are applied to a 4-bit latch circuit U19, bits 7 through 10 are applied to a 4-bit latch circuit U20, and bits 11 through 14 are applied to a 4-bit latch circuit U21. The 4-bit latch circuits are ICs, which are available on the commercial market and their function and operation are well known to those skilled in the art and will not be further described herein. Each latch circuit U18 through U21 will receive digital bit information and store same whenever an enable signal is applied over the conductor means 50 which is coupled in common to all the control enable inputs of the 4-bit latch circuits. The output of bit 1 in latch circuit U18 is by way of conductor 15 directly to the control input of switch S1 in the bipolar switch U5. This bit 1 is also applied as one input to an exclusive-OR circuit U25. The second output for bit 2 is by way of conductor 51 coupled as a second input to the exclusive-OR circuit U25, the output 14 of which is to the control input of S2 in the bipolar switch U5. The four outputs of each of the 4-bit latch circuits U19, U20, and U21 are coupled respectively as four inputs to each of three true/complement circuits U22, U23, and U24. Each true/complement circuit has a control input from the conductor 52 which is the bit 2 signal on the output 51 from the latch circuit 18 passes through an inverter U26. The true/complement circuits are also ICs available on the commercial market, the operation and function of which are known to those skilled in the art and will not be described further herein. The true/complement circuits U22 through U24 will pass a digital bit from each input to the output unchanged whenever the control input is a digital "1" and will produce the complement of the input whenever the control input on 52 is a "0." The digital bits 1 through 14 represent the angular binary format of the input in which bit 1 represents 180°, bit 2 represents 90°, bit 3 represents 45°, bit 4 represents 22.5° and bits 5 through 14 represent the halving of the preceding angle in which bit 14 thereby represents 0.022°. Accordingly, it may be recognized that bit 3 represents the most significant bit in the cosine and sine function generators but its output over conductor 55 and each succeeding lower significant bit through the output conductors 56 through 66 are coupled respectively, to the common control inputs 36 through 46 of the sine and cosine generators.

It may be readily seen from the above description that bit 1 controls the phase relation 0° or 180° of the reference voltages 10 and 11 into the sine function generator through S1 of U5 while the output of U25 controls the phase relation of 0° or 180° over the conductor 18 to the cosine function generator. Bit 2 also controls the enable input by conductors 51 and 52 of the true/complement circuits U22 through U24. A detailed operation of the circuit in FIG. 1 will be provided hereinbelow after the development and description of FIGS. 2, 3, and 4.

Figure 2:
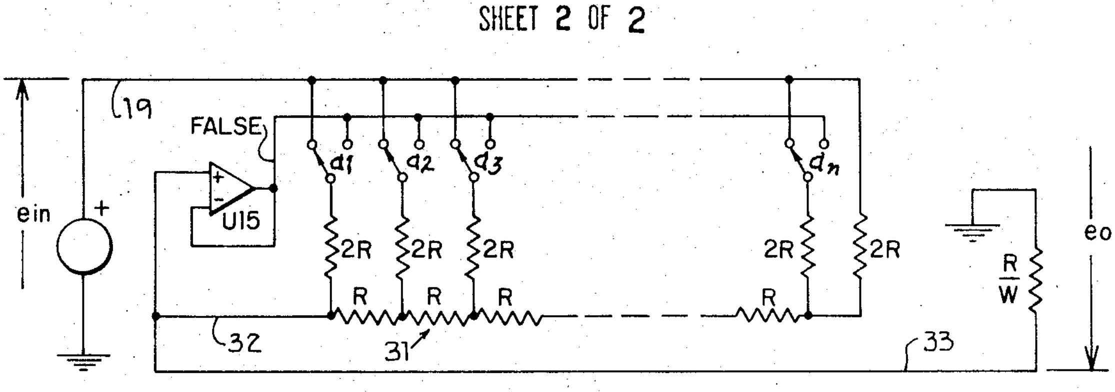
FIG. 2 is a circuit schematic partially in block of the G(sin) function generator shown in FIG. 1.

Referring more particularly to FIG. 2, the basic sine function generator is shown with its implementation of the resistive ladder network 31. The digital input word, $D_n$, controls the solid state switches, illustrated herein by $a_1$ through $a_n$, with $a_1$ being the MSB, or the 45° bit. The generator $e_{in}$ is the A. C. analog reference voltage. The output, $e_o$, is taken across the weighting resistor, R/W. Assuming all switches in the digital "true" position where the $e_{in}$ analog voltage is fed to the resistance ladder, R-2R, then, $$e_o(T) = K(a)\, e_{in}\, (\mathrm{R/W})/R + (\mathrm{R/W})$$

where: $K(a)$ is the transfer function of the network from the true input to the output. $W$ = the weighting constant. More precisely, assuming an infinite number of bits, $$K(a) = \sum_{1}^{n} \frac{D_n}{2^n}$$

Where:

$D_n = 1$ (True)
$D_n = 0$ (False)

Simplifying the above expression results in $$e_o(T)=e_{in}K(a)\,(1/W+1) \qquad (1)$$

Next assuming all switches are in the "false" position where the feedback input is connected to the R-2R ladder, then, $$e_o(F)=e_o\overline{K(a)}\cdot 1/W+1 \qquad (2)$$

where: $\overline{K(a)}$ is the transfer function of the network from the "false" input to the output. Using the superposition thereon, equations (1) and (2) can be combined to find the total output, $e_o$.

$$e_o=e_o(T)+e_o(F).$$

Substituting $$e_o=e_{in}K(a)\,(1/W+1)+e_o\overline{K(a)}\cdot 1/W+1$$

$$e_o[1-\overline{K(a)}\,(1/W+1)]=e_{in}K(a)\,(1/W+1)$$

$$\frac{e_0}{e_{in}}=\frac{K(a)\dfrac{1}{W+1}}{1-\overline{K(a)}\dfrac{1}{W+1}}=\frac{K(a)}{(W+1)-\overline{K(a)}} \qquad (3)$$

Since there are only two possible positions for each switch, if assuming an infinite number of bits, it follows that $$\overline{K(a)}=1-K(a) \qquad (4)$$

Substituting equation (4) into equation (3) yields, $$E_o/e_{in}=G(\sin)=K(a)/[(W+1)-(1-K(a))]$$

$$G(\sin)=K(a)/[K(a)+W] \qquad (5)$$

The cosine generator differs from the sine generator only in that the digital input is complemented. Therefore, it follows from equation (3) that $$G(\cos)=\overline{K(a)}/[(W+1)-K(a)]$$

$$G(\cos)=[1-K(a)]/[(W+1)-K(a)] \qquad (6)$$

The tangent function is given by $$\frac{G(\sin)}{G(\cos)}=\frac{\dfrac{K(a)}{K(a)+W}}{\dfrac{1-K(a)}{(W+1)-K(a)}}$$

$$G(\tan)=\frac{K(a)}{1-K(a)}\cdot\frac{(W+1)-K(a)}{K(a)+W} \qquad (7)$$

The above $G(\tan)$ expression assumes an infinite length ladder network. In the hardware implementation a 12-bit network is used. Expression (4) is altered to $$\overline{K(a)}=1-K(a)+1\ \text{LSB}.$$

Expression (7) then becomes, $$G(\tan)=\frac{K(a)\qquad(W+1)-K(a)}{W+K(a)-\dfrac{1}{2^n}\left[1-K(a)+\dfrac{1}{2^n}\right]}$$

To compensate for this finite ladder length a 2R terminating resistor is added to the network. This results in a maximum error of 1 LSB. If the terminating resistor were omitted, a 2 LSB error would occur at the quadrant switching point. Equation (7) is the identical algebraic expression as found for the weighted binary ladder. It follows, therefore, that the theoretical analysis developed for the weighted binary implementation also correctly describes the R-2R implementation. As a result, the optimum value for $W$ is 1.8015 as it is for the weighted binary ladder circuit.

The sine function generator and cosine function generator, referred to herein as G(sin) and G(cos) generators, operate only over a 90° angular range. It is necessary, therefore, to provide circuitry which programs the G(sin) and G(cos) generators over the four quadrants 0° to 360° angular range. To accomplish this, the quadrant switching circuitry provides the proper AC reference signals, while the logic decoding circuitry provides the proper digital signals. Referring to FIG. 1, the 0° phase reference signal is amplified by impedance isolation amplifier U1, and the 180° phase reference signal is similarly amplified by U2. These two signals are applied to U5 at points 12 and 13. The position of switch S1 is controlled by bit 1 (180°). If bit 1 is logic "true" then the 180° phase reference is applied to the G(sin) generator at point 19. For a logic "false" signal 0° reference phase is applied to the G(sin) input. Similarly, switch S2 applies either 0° reference phase or 180° reference phase to the analog input of the G(cos) generator. Amplifiers U3 and U4 are required to provide impedance isolation. Switch S2 is controlled by the "exclusive-OR" logic function of bit 1 and bit 2.

Figure 3:
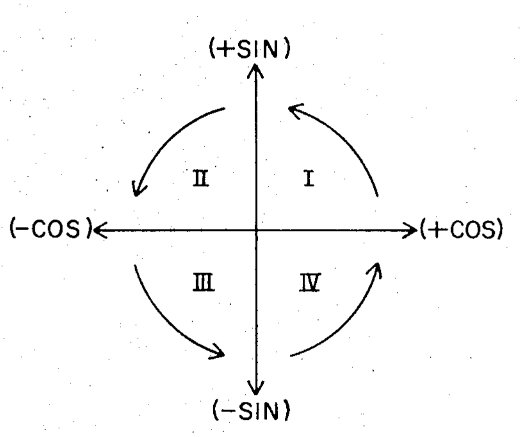
FIG. 3 illustrates the quadrant reference of rotation of the sine and cosine functions.
Figure 4:
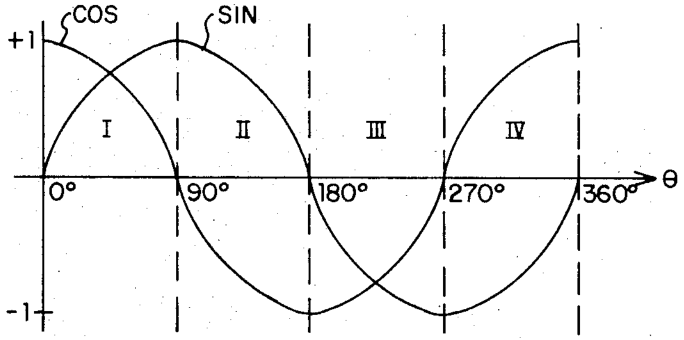
FIG. 4 illustrates in waveforms the sine and cosine reference phase relationship.

TABLE I and FIGS. 3 and 4 illustrate why the exclusive OR function is required. It is seen that quadrants I and II are described by the 0° phase reference which corresponds to the +sin designation of FIG. 3. From FIG. 3 it is noted that the III and IV quadrants require a 180° reference phase or −sin reference. This is summarized in column (6) of TABLE I.

TABLE I

| (1) Quad | (2) Bit 1 | (3) Bit 2 | (4) Bit 3 ⊕ Bit 2 | (5) Angle | (6) G (sin) ref. | (7) G (cos) ref. |
|---|---|---|---|---|---|---|
| I | 0 | 0 | 0 | 0°→90° | 0° | 0° |
| II | 0 | 1 | 1 | 90°→180° | 0° | 180° |
| III | 1 | 0 | 1 | 180°→270° | 180° | 180° |
| IV | 1 | 1 | 0 | 270°→360° | 180° | 0° |

It is noted that the G(sin) reference phase is described exactly by bit 1, so bit 1 can be used directly to control switch S1 of FIG. 1. Column (7) summarizes the G(cos) reference requirements which can be verified from FIG. 3. This pattern corresponds to the logical function bit 1  bit 2. The implementation of FIG. 1 contains the exclusive-OR gate U25 for this reason.

In order to achieve continuity from 0° to 360°, it is also necessary to complement bit 3 through bit 14 in the II and IV quadrants. This is the function of integrated circuits U22, U23, and U24, which are controlled by bit 2 at point 52. These ICs transmit all bits unchanged when a logic "1" is present at point 52. When a logic "0" is present, all bits are complemented. Complementation is required to maintain continuous, counterclockwise rotation of the synchro angle from 0° to 360°. FIG. 4 shows that at the interface between each quadrant the G(sin) and G(cos) functions must be interchanged to provide continuous operation. If the signals were not complemented the G(sin) signal would abruptly go to zero at 90° + 1 LSB. Similarly, the G(cos) function would go to the negative of its maximum value. The outputs 23 and 33 from the cosine and sine function generators may be applied directly to a two-phase synchro receiver or, as shown herein, through an output Scott-T transformer 70 to produce analog voltage synchro signals P1, P2, and P3 for a three-phase synchro receiver. The output is in three-wire synchro format where $E(\mathrm{P1}) = [\mathrm{K1Eo} \sin \theta] \sin (\omega t + \phi)$ $E(\mathrm{P2}) = [\mathrm{K2Eo} \sin (\theta + 120°)] \sin (\omega t + \phi)$ $E(\mathrm{P3}) = [\mathrm{K3Eo} \sin (\theta - 120°)] \sin (\omega t + \phi)$ The portion of the expression in brackets above represents the amplitude of the signal, while the $\sin (\omega t + \phi)$ term is the AC carrier signal. The K terms are gain constants and $\theta$ is the synchro angle. Other input and/or output formats can be implemented without affecting the basic operation of the invention, such as a two-phase synchro output hereinbefore described.

OPERATION

In the operation of the device as shown in FIG. 1 let it be assumed that a reference AC voltage is applied to terminals 10 and 11 and digital bits in the format of "0" and "1" are applied as bits 1 through 14. If bit 1 is a "0," the switch S1 in U5 will remain unchanged and the 0° phase will be applied as a "false" input over 19 to the sine generator as shown in TABLE I. If bit 2 is a "1" the exclusive-OR circuit U25 will produce a "1" over conductor 14 and terminal input to switch S2 of U5 to produce a 180° "true" phase signal to the left inputs of U6, U7, and U8. With an enabling voltage on conductor 50 the latch circuits U18 through U21 will be enabled to apply the digital input bits 3 through 14 to the true/complement circuits U22 through U24. Since bit 2, as above stated, was a "1," U26 will complement this "1" to a "0" input for switches on true/complement circuits U22 through U24 to the complement of bits 3 through 14 and apply these complement bits through the outputs 55 through 66 to the common connectors 35 through 46 to the control inputs of U6 through U8 and U12 through U14. The bits 1 and 2 establish the 0° input to the G(sin) reference generator and the 180° phase to the cosine generator placing the angle in quadrant II, as shown in FIG. 3. The angle in quadrant II depends on the digital inputs over bits 3 through 14. Starting with the least significant bit 14, angles are made increasingly greater up to the maximum of 45° input by bit 3 and by bit 3 being in the "1" state and applying again bits 14 down through bit 4, or combinations thereof, the complete 90° range throughout quadrant II can be obtained. Similar inputs over bits 3 through 14 would carry out rotation through any of the other quadrants depending on the bit 1 and bit 2 states, as hereinabove described for obtaining full 360° rotation. The digital bit inputs of bits 3 through 14 or complements thereof applied to the control inputs 35 through 46 establish the inputs to the resistance ladders 21 and 31, the outputs of which produce the proper analog voltage corresponding to the digital inputs to produce the sine and cosine analog voltage references on outputs 33 and 23, respectively. As hereinbefore stated, these two outputs 23 and 33 could be to a two-phase synchro device to control angular rotation in correspondence with the digital inputs, or these two sine and cosine analog voltage signals over conductors 33 and 23, respectively, can be applied to an output Scott-T transformer 70, as shown in FIG. 1, to produce the synchro signals P1, P2, and P3 to a three-phase synchro receiver. Accordingly, any digital angular input over bits 1 through 14 will produce corresponding analog voltage angular outputs over 23 and 33 for a two-phase synchro mechanism or produce through a Scott-T transformer the P1,P2,P3 synchro outputs to produce a synchro receiver shaft angular position in direct correspondence with digital angular input.

All of the sources of error in the converter are analog except for the implementation error due to the finite termination ladder of the networks. With presently available integrated circuits it is possible to achieve 13 bit (± 0.022°) relative accuracy and 14 bit or better resolution. For this reason a 14 bit converter was chosen for the example of operation; however the basic operation of the invention is independent of the number of bits in the implementation. Some of the static sources of the analog error are:

1. finite switch "on" resistance
2. switch "on" resistance mismatch
3. switch "off" leakage resistance
4. switch offset voltage
5. amplifier gain error
6. amplifier input voltage and current mismatch
7. amplifier input impedance (not infinite)
8. amplifier output impedance
9. active device noise
10. resistor matching tolerances
11. transformer accuracy
12. finite ground impedance
13. the choice of K value In addition, all of the above errors are functions of temperature and bias voltage.

While many modifications may readily occur to those skilled in the art in the implementation of the illustrated invention in FIG. 1 by the choice of additional bit information and additional integrated circuits, it is to be understood that I desire to be limited in the spirit of my invention only by the scope of the appended claims.

I claim:

1. A digital angular voltage-to-analog angular voltage converter for synchros comprising:

a plurality of digital bit voltage inputs representative of an angular data position;

storage means having inputs coupled to said plurality of digital bit voltage inputs and having a corresponding number of outputs;

complement switching means coupled to said respective storage means outputs and having a plurality of outputs;

a sine function generator and a cosine function generator, each having a plurality of solid state bipolar switches with each bipolar switch having two inputs, an output, and a control input, one input of each bipolar switch in each sine function and cosine function generator being coupled in common and the other input of each bipolar switch in each sine function and cosine function generator being coupled in common, and one each of said plurality of outputs from said complement switching means coupled in parallel to one each of the control inputs of said bipolar switches in said sine function and cosine function generators, and having an R-2R resistance ladder for each plurality of solid state bipolar switches of said sine function generator and said cosine function generator, each resistance ladder having a plurality of inputs coupled respectively to said sine function generator solid state switch outputs and to said cosine function generator solid state switch outputs, each resistance ladder having an output with each said output fed back respectively to one of said common coupled inputs of each sine function and cosine function generator plurality of solid state bipolar switches, said outputs constituting respectively said sine function generator output and said cosine generator output;

a quadrature switching means having an alternating current reference voltage input, two outputs, and two control inputs, said two outputs being coupled respectively to said other common coupled inputs of said bipolar switches in said sine and said cosine function generators, and said two control inputs coupled respectively to first and second digital bit voltage inputs controlling the quadrature output of said reference voltage; and an output coupling having two inputs coupled respectively to said sine function and cosine function generator outputs and having synchro outputs whereby said digital bit voltage inputs provide digital angular data inputs to each said sine function and cosine function generators, the outputs thereof through said R-2R resistance ladder networks providing analog sine and cosine voltages in accordance with quadrature switching throughout four quadrants of 360 degrees to reproduce synchro signal outputs corresponding to the digital angular data inputs.

2. A digital angular voltage-to-analog angular voltage converter for synchros as set forth in claim 1 wherein said third and higher digital bit voltage inputs coupled through said latching circuits and said complement switching circuits to said control inputs of said sine and cosine function generators, respectively provide digital control from the most significant bit to the least significant bit in that sequence.

3. A digital angular voltage-to-analog angular voltage converter for synchros as set forth in claim 2 wherein said R-2R resistive latter networks each consist of a series of first resistors with said solid state switch outputs of said sine and cosine function generators each coupled through second resistors of double the value of said first resistors to junctions of said first resistors, one second resistor being in said feedback to the first resistor-second resistor junction at the least significant bit.

4. A digital angular voltage-to-analog angular voltage converter for synchros as set forth in claim 3 wherein said sine function and cosine function generator outputs from said respective resistance ladders are through amplifiers to said respective feedback and to said output coupling and said output coupling is a Scott-T transformer having three synchro outputs.

5. A digital angular voltage-to-analog angular voltage converter for synchros as set forth in claim 4 wherein said sine function generator and cosine function generator output couplings to said Scott-T transformer include amplifiers for predetermined scale factors.

6. In a digital angular voltage-to-analog angular voltage converter for synchros having a digital-to-analog circuit network comprising:

a resistance network including a plurality of first resistors all of equal value R in series and a plurality of second resistors each of double value of each first resistor and having one end of each second resistor coupled to one each junction of said plurality of first resistors and one second resistor in series with one end of the first resistor series, said other end of each of said second resistors constituting inputs and the end of said first resistor series opposite said one second resistor constituting an output;

a plurality of bipolar switches, each having first and second input terminals, a control terminal, and an output terminal, all first input terminals being coupled in common and coupled to said one second resistor, and all second input terminals being coupled in common, and each output terminal being coupled respectively to one each second input of said resistor network;

a phase voltage source coupled to said second common coupled input terminals of said bipolar switches to supply phased voltage to said resistance network;

an amplifier having an input coupled to said resistance network output and an output coupled to said first common coupled inputs of said bipolar switches for feeding back "false" signals into said resistance network; and a weighted resistor of a value R/W, where W is equal to 1.8015, said weighted resistor having an input coupled to said resistance network output and having an output whereby digital voltage signals representative of a signal data information value applied to said control terminals of said plurality of bipolar switches will switch same to couple said first and second resistors in a combination to produce an analog voltage from said phased voltage through said weighted resistor output corresponding in analog voltage value representative of said signal data information value.

7. In a digital angular voltage-to-analog angular voltage converter as set forth in claim 6 wherein said amplifier is an impedance isolation amplifier having a positive terminal input being said input from said resistance network output and having a negative terminal input coupled in feedback from said amplifier output.

8. In a digital angular voltage-to-analog angular voltage converter as set forth in claim 6 wherein said bipolar switches are initially connectible to initially connect either of said first and second commonly coupled inputs to produce sine function analog voltage and cosine function analog voltage respectively on said weighted resistor output.

* * * * *